(12) United States Patent  
Kimura

(10) Patent No.: US 8,179,108 B2
(45) Date of Patent: May 15, 2012

(54) REGULATOR HAVING PHASE COMPENSATION CIRCUIT

(75) Inventor: Hiroyuki Kimura, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 524 days.

(21) Appl. No.: 12/534,128

(22) Filed: Aug. 2, 2009

(65) Prior Publication Data

US 2011/0025280 A1 Feb. 3, 2011

(51) Int. Cl.
G05F 1/575 (2006.01)

(52) U.S. Cl. ...................................... 323/280

(58) Field of Classification Search .................. 323/273, 323/280
See application file for complete search history.

(56) References Cited

U.S. PATENT DOCUMENTS

| | | |
|---|---|---|
| 4,282,477 A | 8/1981 | Ahmed |
| 4,531,173 A | 7/1985 | Yamada |
| 5,208,718 A | 5/1993 | Fox |
| 5,550,462 A | 8/1996 | Nakajima |
| 5,675,240 A | 10/1997 | Fujisawa et al. |
| 6,005,378 A | 12/1999 | D'Angelo et al. |
| 6,160,490 A | 12/2000 | Pace |
| 6,340,878 B1 | 1/2002 | Oglesbee |
| 6,541,946 B1 | 4/2003 | Chen |
| 6,690,147 B2 | 2/2004 | Bonto |
| 6,861,827 B1 | 3/2005 | Yang |
| 6,952,091 B2 | 10/2005 | Bansal |
| 6,960,907 B2 | 11/2005 | Poss |
| 6,965,223 B1 | 11/2005 | MacLean |
| 6,989,659 B2 | 1/2006 | Menegoli |
| 7,042,280 B1 | 5/2006 | Huang et al. |
| 7,091,710 B2 | 8/2006 | Yang |
| 7,129,686 B1 | 10/2006 | Huang |
| 7,173,401 B1 | 2/2007 | Huang |
| 7,176,668 B2 | 2/2007 | Oswald |
| 7,221,132 B2 | 5/2007 | Okubo |
| 7,224,156 B2 | 5/2007 | Chen |
| 7,245,115 B2 | 7/2007 | Chilcote |
| 7,339,775 B2 | 3/2008 | Kimura |
| 7,405,546 B2 | 7/2008 | Amrani |
| 7,411,376 B2 | 8/2008 | Zhang |
| 7,414,384 B2 | 8/2008 | Kimura |
| 7,420,356 B2 | 9/2008 | Hojo |
| 2007/0018621 A1 | 1/2007 | Mok et al. |
| 2007/0182399 A1 | 8/2007 | Enjalbert |
| 2008/0048626 A1 | 2/2008 | Kimura |
| 2008/0191671 A1 | 8/2008 | Shikata |
| 2008/0191673 A1 | 8/2008 | Kimura |
| 2008/0208513 A1 | 8/2008 | Depuy et al. |
| 2008/0218223 A1 | 9/2008 | Kimura |
| 2008/0225456 A1 | 9/2008 | Daio et al. |
| 2008/0258691 A1 | 10/2008 | Lai et al. |
| 2008/0258696 A1 | 10/2008 | Kimura |
| 2011/0025280 A1* | 2/2011 | Kimura .......................... 323/282 |

* cited by examiner

Primary Examiner — Jeffrey Sterrett
(74) Attorney, Agent, or Firm — Charles Bergere

(57) ABSTRACT

A regulator circuit includes an output transistor that generates an output current in accordance with a control voltage that is applied to a control terminal of the output transistor. A differential amplifier provides feedback control of the control voltage in accordance with a level of the output current. A phase compensation circuit is connected to the differential amplifier and the control terminal of the output transistor. The phase compensation circuit adjusts an output impedance of the differential amplifier. The phase compensation circuit includes a variable resistor that decreases the output impedance of the differential amplifier when the output current increases.

10 Claims, 3 Drawing Sheets

REGULATOR HAVING PHASE COMPENSATION CIRCUIT

BACKGROUND OF THE INVENTION

The present invention relates to integrated circuits and more particularly, to a regulator having a phase compensation circuit.

Constant voltage circuits, such as series regulators, typically include a phase compensation capacitor to compensate for phase shifts in signals circulating through a feedback loop to stabilize operation. Japanese Laid-Open Patent Publication No. 2004-21577 describes a constant voltage circuit incorporating a phase compensation capacitor in an IC chip. The constant voltage circuit illustrated in FIG. 1 of this publication generates, along with an internal phase compensation capacitor, a phase compensation signal that is in accordance with the output current of a control transistor. The constant voltage circuit uses the phase compensation signal to compensate for phase shifts in a feedback signal. The constant voltage circuit also includes a correction circuit that adjusts the phase compensation amount in accordance with operational conditions, such as the output current. This allows for phase compensations to be performed for a wide range of operational conditions. However, with this prior art structure, it is difficult to physically reduce the size of the constant voltage circuit. Generally, the phase compensation capacitor occupies a large area of the constant voltage circuit (IC chip). For example, the phase compensation capacitor may require a capacitance of over 100 pF depending on conditions, such as the load current, load impedance, and transitional response request. Thus, the incorporation of the phase compensation capacitor in the constant voltage circuit hinders miniaturization of the constant voltage circuit.

Japanese Laid-Open Patent Publication No. 2005-100296 describes a method for separating rotation of a phase with an externally connected output stabilization capacitor. In this case, an external phase compensation capacitor is connected to a constant voltage circuit formed on a chip. In the structure shown in FIG. 1 of this publication, to separate the rotation of a phase with the externally connected output stabilization capacitor, a resistor is connected between the capacitor and an output terminal of the constant voltage circuit. To obtain a large phase margin for a phase shift in a feedback signal, the phase compensation circuit compensation compensates for a phase shift with a circuit that combines the resistor and capacitor. This generates a "zero" in the frequency characteristics (gain curve) of the constant voltage circuit. When the output current of the constant voltage circuit increases, a large drop occurs in the output voltage at the resistor of the phase compensation circuit connected to the output terminal of the constant voltage circuit. To compensate for the large drop, the constant voltage circuit detects the drain current (output current) of an output transistor with a current detection transistor and generates a mirror current that is proportional to the output current. The output voltage of the constant voltage circuit increases in accordance with the generated mirror current. This compensates for phase shifts while compensating for the output voltage drop that occurs at the resistor of the phase compensation circuit. In this case, it is preferable that the constant voltage circuit detects the output current with a mirror current that is as small as possible. Thus, the mirror current is generated with an extremely small value with respect to the drain current of the output transistor. For example, the mirror current is generated with respect to the drain current of the output transistor with a current ratio of 1/1,000 or 1/10,000. Thus, for a current mirror of the output transistor and the current detection transistor, it is difficult to maintain offset errors and gain errors within a tolerable range. As a result, it is practically difficult to maintain the phase compensation accuracy with an output current having a wide range while ensuring accuracy of the output voltage.

It would be advantageous to be able to fabricate a small constant voltage circuit that does not have to need a large phase compensation resistor.

BRIEF DESCRIPTION OF THE DRAWINGS

The invention, together with objects and advantages thereof, may best be understood by reference to the following description of the presently preferred embodiments together with the accompanying drawings in which:

FIG. 4A shows the frequency-gain characteristics and FIG. 4B shows the frequency-phase characteristics;

DETAILED DESCRIPTION OF THE DRAWINGS

Figure 1:
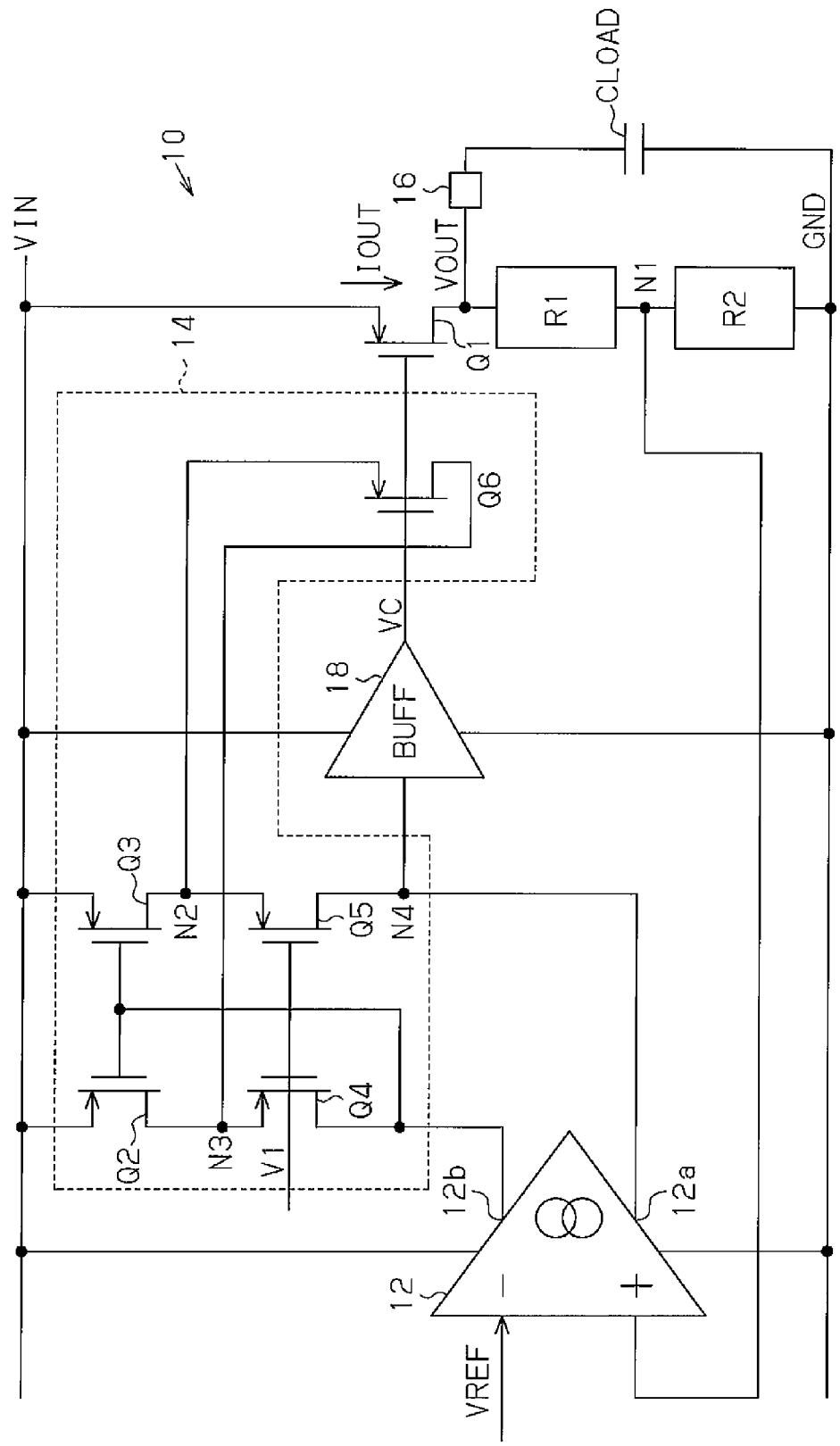
FIG. 1 is a schematic block diagram of a regulator circuit including a phase compensation circuit.

The present invention provides a regulator that has improved phase margin within a wide range of the output current.

One aspect of the present invention is a regulator provided with an output transistor including a control terminal to which a control voltage is applied. The output transistor generates an output current in accordance with the control voltage. A differential amplifier controls via feedback the control voltage in accordance with the level of the output current. A phase compensation circuit is connected between the differential amplifier and the control terminal of the output transistor. The phase compensation circuit adjusts an output impedance of the differential amplifier. The phase compensation circuit includes a variable resistor that decreases the output impedance of the differential amplifier when the output current increases.

A further aspect of the present invention is a regulator provided with an output transistor that generates an output current in accordance with a control voltage based on an input voltage. A differential amplifier detects the output current and includes a first output terminal, which generates a non-inverted amplification signal that controls the control voltage, and a second output terminal, which generates an inverted amplification signal that is complementary to the non-inverted amplification signal. A phase compensation circuit controls a loop gain of the regulator. The phase compensation circuit includes a first transistor having first and second current terminals and being responsive to the non-inverted amplification signal. A second transistor is driven by the inverted amplification signal and has a first current terminal, to which the input voltage is applied, and a second terminal, which is connected to the first current terminal of the first transistor. A third transistor is driven by a bias voltage and has a first current terminal, which is connected to the second current terminal of the second transistor, and a second current terminal, which is connected to the first output terminal of the differential amplifier. A fourth transistor is driven by the inverted amplification signal and has a first current terminal, to which the input voltage is applied, and a second terminal, which is connected to the second current terminal of the first transistor.

Other aspects and advantages of the present invention will become apparent from the following description, taken in conjunction with the accompanying drawings, illustrating by way of example the principles of the invention.

In the drawings, like numerals are used for like elements throughout.

An embodiment of a series regulator 10 will now be discussed with reference to the drawings. In one example, the series regulator 10 is a low dropout (LDO) regulator that uses a single output transistor Q1 as a pass transistor. In an LDO, the voltage drop that occurs between the two terminals of the output transistor Q1 is extremely small. This allows for the regulator output to be maintained at an optimal level.

Referring now to FIG. 1, the series regulator 10 includes a differential amplifier 12, a phase compensation circuit 14, and the output transistor Q1. The output transistor Q1 is formed by a p-type MOS transistor and has a source to which an input voltage VIN is applied. The drain of the output transistor Q1 is connected to an output terminal 16. A load capacitor CLOAD is connected between the output terminal 16 and ground. The drain of the output transistor Q1 is also connected to ground via series-connected resistors R1 and R2. A control voltage VC is applied to the gate of the output transistor Q1. In response to the control voltage VC, the output transistor Q1 generates an output current IOUT. The resistors R1 and R2 form an attenuation circuit and determine the attenuation ratio relative to an output voltage VOUT.

The differential amplifier 12 includes a first input terminal (non-inverting input terminal), which is connected to a node N1 between the resistors R1 and R2, and a second input terminal (inverting input terminal), to which a reference voltage VREF is applied. The resistors R1 and R2 generate a divided voltage of the output voltage VOUT at node N1. Thus, a voltage corresponding to the level of the output voltage VOUT is applied as a feedback voltage to the first input terminal of the differential amplifier 12. The differential amplifier 12 amplifies the voltage difference between the feedback voltage and the reference voltage VREF, outputs a non-inverted amplification signal from a first output terminal (non-inverting output terminal) 12a, and outputs an inverted amplification signal from a second output terminal (inverting output terminal) 12b. The first output terminal 12a of the differential amplifier 12 is connected to a buffer circuit 18.

The phase compensation circuit 14, which is connected to the first and second output terminals 12a and 12b of the differential amplifier 12, includes transistors Q2 to Q6, each of which is a PMOS transistor. The input voltage VIN is applied to the sources of the transistors Q2 and Q3. The gates of the transistors Q2 and Q3 are connected to each other and to the second output terminal 12b (inverting output terminal) of the differential amplifier 12. The drain of the transistor Q2 is connected to the source of the transistor Q4 and the drain of the transistor Q6. The drain of the transistor Q3 is connected to the source of the transistor Q5 and the source of the transistor Q6. The drain of the transistor Q4 is connected to the second output terminal 12b of the differential amplifier 12 and to the gates of the second and third transistors Q2 and Q3. The drain of the transistor Q5 is connected to the first output terminal 12a of the differential amplifier 12, and to the input of the buffer 18.

A bias voltage V1 is applied to the gates of the transistors Q4 and Q5 to drive the transistors Q4 and Q5. The transistors Q2 and Q3 form a current mirror, the transistors Q3 and Q5 form a first cascode circuit, and the transistors Q2 and Q4 form a second cascode circuit.

The first cascode circuit varies the potential at a node N2 located between the transistors Q3 and Q5 in accordance with the current value of the non-inverted amplification signal from the differential amplifier 12. The second cascode circuit varies the potential at a node N3 located between the transistors Q2 and Q4 in accordance with the current value of the inverted amplification signal from the differential amplifier 12. Accordingly, the drain voltage and source voltage of the transistor Q6 vary relative to each other.

The transistor Q6 is driven based on the non-inverted amplification signal. In the preferred embodiment, the transistor Q6 is driven by the control voltage VC supplied via a buffer circuit 18, which shapes the voltage waveform of the non-inverted amplification signal. The transistor Q6 has a resistance value that is dependent on the control voltage VC applied to its gate, namely, the level of the non-inverted amplification signal. Accordingly, the transistor Q6 functions as a variable resistor. When the resistance value of the transistor Q6 is varied, the impedance of the phase compensation circuit 14 is varied, and the drain potential of the transistor Q5, namely, the level of the non-inverted amplification signal output to node N4 is varied. In other words, the phase compensation circuit 14 varies the output impedance of the differential amplifier 12 with the resistance value of the transistor Q6 to adjust the gain and phase of the feedback loop.

The control voltage VC is also supplied to the output transistor Q1 from the buffer circuit 18. In response to the control voltage VC, the output transistor Q1 maintains the output voltage VOUT at a predetermined level. When the output voltage VOUT increases (i.e., when the output current IOUT decreases), the differential amplifier 12 increases the voltage of the non-inverted amplification signal to increase the control voltage VC. On the other hand, when the output voltage VOUT decreases (i.e., when the output current IOUT increases), the differential amplifier 12 decreases the voltage of the non-inverted amplification signal to decrease the control voltage VC.

Figure 2:
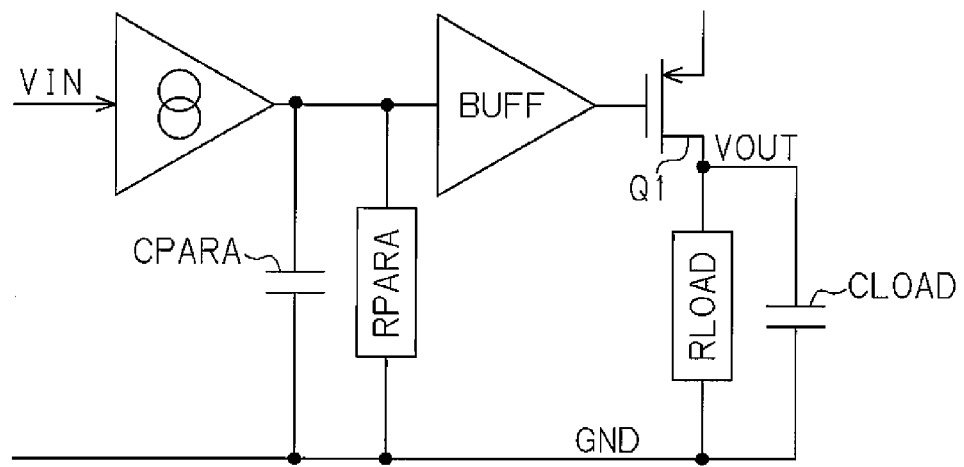
FIG. 2 is a schematic equivalent circuit diagram related to a loop gain analysis for the regulator of FIG. 1.

FIG. 2 is a schematic circuit diagram of an equivalent circuit related to a loop gain analysis for the regulator 10 shown in FIG. 1. A resistor RLOAD and a capacitor CLOAD connected to the drain of the output transistor Q1 respectively indicate the resistance and capacitance of a load (not shown). A resistor RPARA and a capacitor CLOAD, which are connected to the output terminal of the differential amplifier 12 and the input terminal of the buffer circuit 18, respectively indicate the parasitic resistance and the parasitic capacitance of the transistors Q2 to Q6 in the phase compensation circuit 14. When "gm1" represents the gain of a circuit section including the differential amplifier 12 and the phase compensation circuit 14 and "gm2" represents the gain of the output transistor Q1, the loop gain g0 of the regulator 10 is expressed by equation 1.

$$g0 = gm1 * RPARA * gm2 * RLOAD \qquad \text{(Equation 1)}$$

In equation 1, based on the connection relationship of the transistors Q2, Q3, Q5, and Q6 in the phase compensation circuit 14, when the parasitic resistance value (ON resistance value) of the transistors Q2, Q3, Q5, and Q6 are respectively represented by "Rq2", "Rq3", "Rq5", and "Rq6", the resistance value of the parasitic resistor RPARA is expressed in an equivalent manner by equation 2.

$$RPARA = Rq5 + Rq3 // (Rq2 + Rq6) \qquad \text{(Equation 2)}$$

Figure 3:
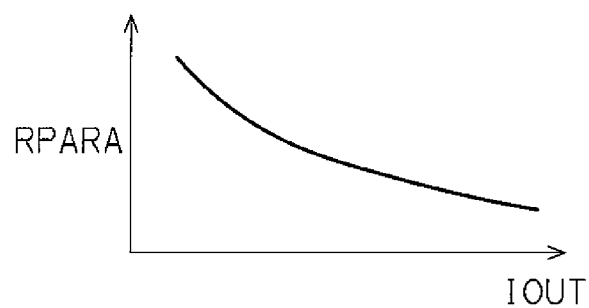
FIG. 3 is a graph showing the resistance characteristics of the phase compensation circuit of FIG. 1.

Here, "//" represents a parallel value of the resistance value Rq3 and the resistance value (Rq2+Rq6). Equation 2 indicates that when the resistance value Rq6 of the transistor Q6 decreases, the value of the parasitic resistor RPARA also decreases. The resistance value Rq6 is determined by the control voltage VC, which drives the transistor Q6. The control voltage VC decreases as the output current IOUT increases. Therefore, when the output current IOUT increases, the resistance value Rq6 of the transistor Q6 decreases. Accordingly, as shown in FIG. 3, when the output current IOUT increases, the value of the parasitic resistor RPARA decreases.

Figure 4A:
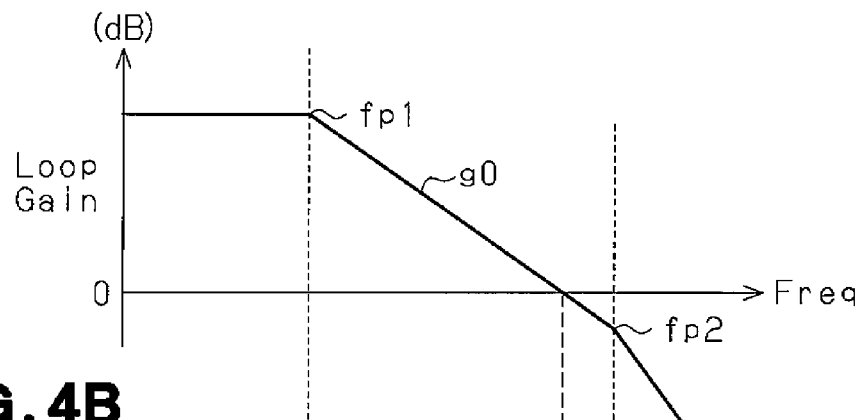
FIGS. 4A and 4B illustrate Bode diagrams showing the loop gain characteristics of the regulator of FIG. 1, where
Figure 4B:
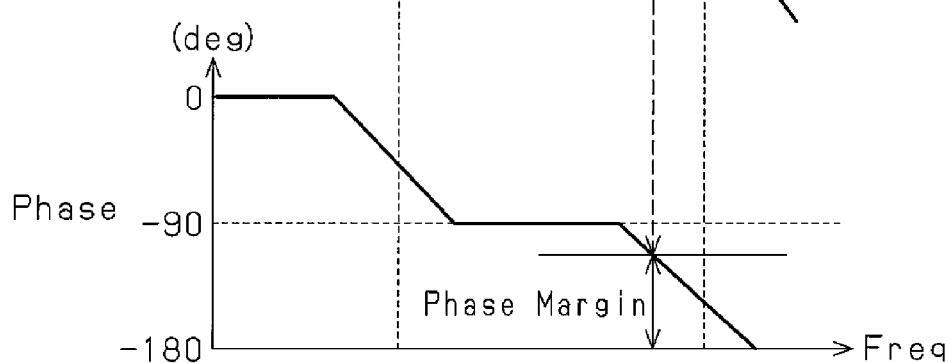

FIG. 4A shows the frequency-loop gain characteristics of the regulator 10, and FIG. 4B shows the frequency-phase characteristics of the regulator 10. In FIG. 4A, "fp1" and "fp2" indicate poles defined as frequency points that apply an inclination of −20 dB/dec to the inclination of the gain curve. The poles fp1 and fp2 are respectively expressed by equations 3 and 4.

$$fp1=1/(2*\pi*CLOAD*RLOAD) \quad \text{(Equation 3)}$$

$$fp2=1/(2*\pi*CPARA*RPARA) \quad \text{(Equation 4)}$$

In this case, the phase margin (deg) shown in FIG. 4B is expressed by equation 5 using the pole fp1, the pole fp2, and the loop gain g0 (equation 1).

$$\text{Phase Margin}=45-45*\log(g0*fp1/fp2) \quad \text{(Equation 5)}$$

Figure 5:
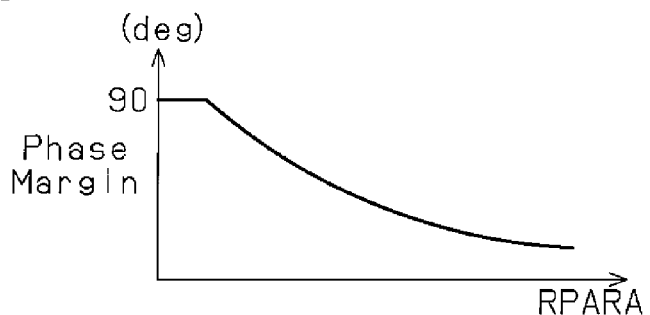
FIG. 5 is a graph showing the phase margin characteristics of the regulator of FIG. 1.

As apparent from equation 1, the loop gain g0 is determined in accordance with the resistor RPARA of the phase compensation circuit 14. Here, when the output current IOUT increases, the resistance of the resistor RPARA decreases (refer to FIG. 3). Thus, the loop gain g0 decreases. When the resistance of the resistor RPARA decreases, the pole fp2 increases. Accordingly, when the resistance of the resistor RPARA increases (i.e., when the output current IOUT increases), the phase margin of the regulator 10 increases as shown in FIG. 5 and apparent from equation 5. The phase margin is expressed by the difference from −180° of the phase shift amount at the frequency in which the loop gain g0 becomes equal to 0 dB.

Figure 6:
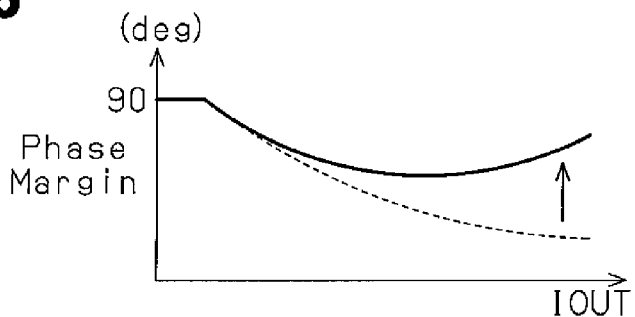
FIG. 6 is a graph showing the phase margin characteristics of the regulator of FIG. 1.

FIG. 6 is a graph showing the phase margin characteristics with respect to the output current IOUT. As shown in FIG. 6, in the region in which the output current IOUT increases, the phase margin of the regulator 10 is improved in comparison with the prior art (indicated by broken line). This is because, referring to FIGS. 3 and 5, the transistor Q6 of the phase compensation circuit 14 decreases the output impedance (resistance of resistor RPARA) of the differential amplifier 12 as the output current IOUT increases.

In the preferred embodiment, the regulator 10 has the advantages described below.

The phase compensation circuit 14 includes the transistor Q6, which is controlled in accordance with the output current IOUT and functions as a variable resistor. The transistor Q6 decreases the resistance of the resistor RPARA in the phase compensation circuit 14 with an inverse function of the output current IOUT. When the resistance of the resistor RPARA decreases and the output impedance of the differential amplifier 12 decreases, the phase margin of the regulator 10 is increased. Thus, the phase margin is increased even in a region in which the output current IOUT increases. Accordingly, a larger phase margin may be obtained within a larger output current range.

The phase compensation circuit 14 is formed by the transistors Q2 to Q6 and does not require a phase compensation capacitor in the regulator 10. This allows for reduction in the chip area occupied by the regulator 10.

It should be apparent to those skilled in the art that the present invention may be embodied in many other specific forms without departing from the spirit or scope of the invention. Particularly, it should be understood that the present invention may be embodied in the following forms.

The output transistor Q1 and the transistors Q2 to Q6 of the phase compensation circuit may be bipolar transistors instead of MOS transistors. In each of the transistors Q1 to Q6, the gate functions as a control terminal, the source functions as a first current terminal, and the drain functions as a second current terminal. Accordingly, when bipolar transistors are used in the regulator 10, in each bipolar transistor, the base may function as the control terminal, the emitter may function as the first current terminal, and the collector may function as the second current terminal.

In the phase compensation circuit 14, the transistors Q2 and Q3 may each be formed by a resistor element.

The buffer circuit 18 is not an essential element of the present invention. The transistor Q6 and the output transistor Q1 may be directly driven by the non-inverted amplification signal of the differential amplifier 12 (potential at node N4).

The present examples and embodiments are to be considered as illustrative and not restrictive, and the invention is not to be limited to the details given herein, but may be modified within the scope and equivalence of the appended claims.

What is claimed is:

1. A regulator, comprising:
    an output transistor including a control terminal to which a control voltage is applied, wherein the output transistor generates an output current in accordance with the control voltage;
    a differential amplifier that controls via feedback the control voltage in accordance with a level of the output current; and
    a phase compensation circuit connected between the differential amplifier and the control terminal of the output transistor, wherein the phase compensation circuit adjusts an output impedance of the differential amplifier, and wherein the phase compensation circuit includes a variable resistor that decreases the output impedance of the differential amplifier when the output current increases.

2. The regulator of claim 1, wherein the variable resistor includes a transistor driven with an amplification signal output from the differential amplifier in accordance with the level of the output current.

3. The regulator of claim 1, wherein:
    the differential amplifier detects the output current and generates an inverted amplification signal and a non-inverted amplification signal; and
    the variable resistor includes a first transistor having a first current terminal to which a first voltage corresponding to the non-inverted amplification signal is applied, a second current terminal to which a second voltage corresponding to the inverted amplification signal is applied, and a control terminal to which the control voltage corresponding to the non-inverted amplification signal is applied.

4. The regulator of claim 3, wherein the phase compensation circuit includes:
    a first cascode circuit including cascode-connected second and third transistors, wherein the first cascode circuit generates the first voltage at a first connection node between the second and third transistors based on the non-inverted amplification signal; and a second cascode circuit including cascode-connected fourth and fifth transistors, wherein the second cascode circuit generates the second voltage at a second connection node between the fourth and fifth transistors based on the inverted amplification signal;

wherein the first transistor is connected between the first and second connection nodes.

5. The regulator of claim 1, further comprising:

a buffer circuit connected between the phase compensation circuit and the control terminal of the output terminal, wherein the buffer circuit generates the control voltage.

6. The regulator of claim 5, wherein the variable resistor has a resistance value controlled by the control voltage.

7. The regulator of claim 1, wherein the regulator is a low dropout regulator.

8. A regulator comprising:

an output transistor that generates an output current in accordance with a control voltage based on an input voltage;

a differential amplifier that detects the output current and includes a first output terminal for providing a non-inverted amplification signal that controls the control voltage, and a second output terminal for providing an inverted amplification signal that is complementary to the non-inverted amplification signal;

a phase compensation circuit that controls a loop gain of the regulator, wherein the phase compensation circuit includes:

a first transistor having first and second current terminals and being responsive to the non-inverted amplification signal;

a second transistor driven by the inverted amplification signal and having a first current terminal to which the input voltage is applied, and a second terminal that is connected to the first current terminal of the first transistor;

a third transistor driven by a bias voltage and having a first current terminal that is connected to the second current terminal of the second transistor, and a second current terminal that is connected to the first output terminal of the differential amplifier; and a fourth transistor driven by the inverted amplification signal and having a first current terminal to which the input voltage is applied, and a second terminal that is connected to the second current terminal of the first transistor.

9. The regulator of claim 8, wherein the output transistor and the first transistor are driven by the same control voltage that is in accordance with the non-inverted amplification signal.

10. The regulator of claim 9, further comprising a buffer circuit connected to the differential amplifier, wherein the buffer circuit generates the control voltage from the non-inverted amplification signal.

* * * * *